(12) United States Patent
Lee

(10) Patent No.: US 7,479,408 B2
(45) Date of Patent: Jan. 20, 2009

(54) STACK PACKAGE MADE OF CHIP SCALE PACKAGES

(75) Inventor: Dong-Ho Lee, Kyunggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 137 days.

(21) Appl. No.: 11/536,611

(22) Filed: Sep. 28, 2006

(65) Prior Publication Data

US 2007/0018303 A1   Jan. 25, 2007

Related U.S. Application Data

(62) Division of application No. 10/750,979, filed on Jan. 2, 2004, now Pat. No. 7,190,061.

(30) Foreign Application Priority Data

Jan. 3, 2003   (KR) ................... 2003-0281

(51) Int. Cl.
*H01L 21/50* (2006.01)
*H01L 21/48* (2006.01)
*H01L 21/44* (2006.01)
*H01L 23/02* (2006.01)

(52) U.S. Cl. .................. 438/109; 438/106; 257/686

(58) Field of Classification Search ............. 438/109, 438/106; 257/686

See application file for complete search history.

(56) References Cited

U.S. PATENT DOCUMENTS

| | | | |
|---|---|---|---|
| 6,180,881 B1 | 1/2001 | Isaak | |
| 6,252,298 B1 | 6/2001 | Lee et al. | |
| 6,376,769 B1 | 4/2002 | Chung | |
| 6,768,191 B2 | 7/2004 | Wennemuth et al. | |
| 6,784,530 B2 | 8/2004 | Sugaya et al. | |
| 6,867,501 B2 | 3/2005 | Shibata | |

(Continued)

FOREIGN PATENT DOCUMENTS

JP   2000-216327   8/2000

(Continued)

OTHER PUBLICATIONS

English language abstract of Japanese Publication No. 2000-216327.

(Continued)

*Primary Examiner*—Luan Thai
(74) *Attorney, Agent, or Firm*—Marger Johnson & McCollom, P.C.

(57) ABSTRACT

A stack package of the present invention is made by stacking at least two area array type chip scale packages. Each chip scale package of an adjacent pair of chip scale packages is attached to the other in a manner that the ball land pads of the upper stacked chip scale package face in the opposite direction to those of the lower stacked chip scale package, and the circuit patterns of the upper stacked chip scale package are electrically connected to the those of the lower stacked chip scale package by, for example, connecting boards. Therefore, it is possible to stack not only fan-out type chip scale packages, but to also efficiently stack ordinary area array type chip scale packages.

18 Claims, 3 Drawing Sheets

U.S. PATENT DOCUMENTS

| | | |
|---|---|---|
| 6,876,074 B2 | 4/2005 | Kim |
| 2002/0126459 A1 | 9/2002 | Albert et al. |
| 2004/0057085 A1 | 3/2004 | Maltseff et al. |
| 2004/0124518 A1 | 7/2004 | Karnezos |
| 2004/0150107 A1 | 8/2004 | Cha et al. |
| 2005/0051903 A1 | 3/2005 | Ellsberry et al. |

FOREIGN PATENT DOCUMENTS

| | | |
|---|---|---|
| KR | 2001-0011310 | 2/2001 |
| KR | 2001-0028845 | 4/2001 |

OTHER PUBLICATIONS

English language abstract of Korean Publication No. 2001-0011310.
English language abstract of Korean Publication No. 2001-0028845.

STACK PACKAGE MADE OF CHIP SCALE PACKAGES

BACKGROUND OF THE INVENTION

This application is a Divisional of U.S. patent application Ser. No. 10/750,979, filed on Jan. 2, 2004, now pending, which claims priority under 35 U.S.C. § 119 from Korean Patent Application No. 2003-00281, filed on Jan. 3, 2003, in the Korean Intellectual Property Office, the entire contents of which are hereby incorporated by reference.

1. Field of the Invention

The present invention relates generally to semiconductor packages, and more particularly, to a stack package made of a plurality of area array type chip scale packages.

2. Description of the Prior Art

The miniaturization of semiconductor packages has progressed very rapidly during the past ten years in order to keep up with the miniaturization of electronic devices. This progression of miniaturization has been especially prevalent in the field of mobile electronic devices because of the wide spread usage of chip scale packages (CSP). However, chip scale packages have a disadvantage when compared with conventional lead frame type packages because of the difficulty in using them with package stacking technology.

Stack packages, which are made by stacking a plurality of packages, have been developed and widely used to increase the installation density of chips. The stack package is different from a multi chip package (MCP), which is made by installing a plurality of chips in a package. The multi chip package has advantages in package size and package installation convenience. However, productivity of the multi chip package can be low because often chips that have not been tested for their quality are used, and if even one of the installed chips is inferior in performance, the entire multi chip package becomes interior. On the contrary, the productivity of the stack package is usually superior to that of the multi chip package because all of the packages used for the stack package are tested. Therefore, even though both methods are available, the stack package is the preferred method to enhance chip installation density because of its reliability.

Chip scale packages are generally area array type packages, which are more inappropriate for stacking than lead frame type packages. There has been much effort to develop chip scale packages suitable for package stacking. Three examples of chip scale packages suitable for the stack package are disclosed in FIG. 1-FIG. 3.

FIG. 1 shows a well-known conventional type stack package 600 made of a plurality of chip scale packages. Each stacked chip scale package is a fan-out type ball grid array package 610. As shown in FIG. 1, a semiconductor chip 611 is installed and electrically connected to a beam lead 622 on a circuit board 620. A plurality of solder balls 637 are positioned on the peripheral area of the circuit board 620 and are connected to the semiconductor chip 611 through the beam lead 622.

One problem with the chip scale package 610 disclosed in FIG. 1, is that it is difficult to standardize the arrangement of the solder balls 637, because the arrangement of the solder balls 637 must be designed according to the size of the installed chip. For example, a 512 Mb DRAM chip cannot be installed in a package designed for a 256 Mb DRAM chip. This severely limits the versatility of this type of chip scale package stack.

FIG. 2 shows another conventional type stack package 700. Referring to FIG. 2, each stacked chip scale package 710 is made by attaching a chip 711 to a carrier tape 720 by beam lead bonding. The outer leads 737 of the stacked chip scale packages 710 are electrically connected to each other. In this kind of stack package, it is difficult to standardize each stacked package because the length of the outer leads 737 of each stacked package varies according to the stacked level. This non-standardization of lead parts results in production cost increases.

FIG. 3 shows a further conventional type stack package 800. Referring to FIG. 3, the stack package 800 comprises a plurality of fan-out type chip scale packages 810 and a conventional ball grid array (BGA) type chip scale package 805. The fan-out type chip scale packages 810 are electrically connected to each other and to the BGA chip scale package 805 with solder balls 838 formed on a lower surface of substrate 821. The BGA type chip scale package 805 is stacked at the lowest level. The solder balls 837 are formed on the entire area of the BGA type chip scale package, and function as Input/Output ports of the stack package 800. This kind of stack package has the same technical drawback, i.e., the difficulty of standardizing the solder ball arrangement, as that of the stack package 600.

SUMMARY OF THE INVENTION

A stack package according an embodiment of the present invention comprises at least two area array type chip scale packages. Each chip scale package has a substrate, a plurality of ball land pads formed on a lower surface of the substrate, a plurality of circuit patterns formed on the lower surface of the substrate and electrically connected to the ball land pads, and at least one chip installed on the upper surface of the substrate and electrically connected to the circuit patterns.

Embodiments of the present invention direct the stacked chip scale packages to be attached to one another by orienting the ball land pads of the upper stacked chip scale package so that they face in the opposite direction of those of the lower stacked chip scale package. In addition, the circuit patterns of the upper stacked chip scale package are electrically connected to those of the lower stacked chip size package by connecting boards.

Furthermore, a hole may be formed on the substrate of each chip scale package, to allow the chip to be electrically connected to the circuit patterns by bonding wires passing through the hole.

Additionally, the chip may be protected by a first encapsulating part, and the bonding pads and the bonding wires may be protected by a second encapsulating part.

When an odd number of chip scale packages need to be stacked, a single chip scale package can be stacked on and electrically connected to adjacently stacked chip packages through a plurality of solder balls.

When an even number of chip scale packages needs to be stacked, adjacently stacked chip scale packages coupled by the connecting boards may be stacked on, and electrically connected through a plurality of solder balls to the other adjacently stacked chip scale packages.

A plurality of connection pads may be further formed on the region of each substrate on which the plurality of ball land pads are formed, and electrically connected to the circuit patterns. The connecting boards may then be attached to the connection pads so that they may be electrically connected to the circuit patterns through the connection pads.

Also, each chip scale package of an adjacent pair of chip scale packages may be attached to the other by an adhesive applied on the first encapsulating part or each package.

BRIEF DESCRIPTION OF THE DRAWINGS

The above features and advantages of the present invention will become more apparent by describing in detail an exemplary embodiment thereof with reference to the attached drawings, in which.

DETAILED DESCRIPTION OF EXEMPLARY EMBODIMENT

Figure 1:
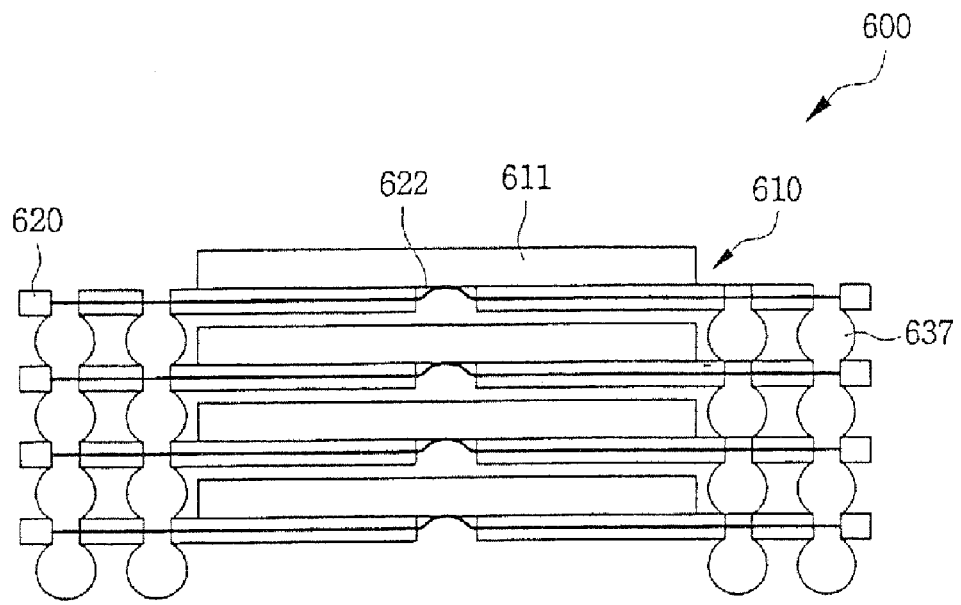
FIG. 1 is a conventional stack package made of a plurality of chip scale packages.
Figure 2:
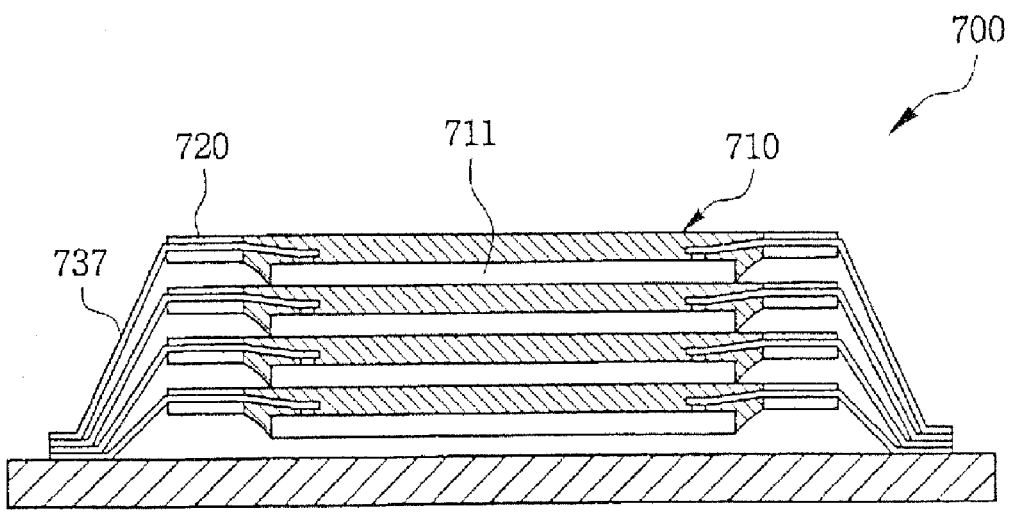
FIG. 2 is another type of conventional stack package made of a plurality of chip scale packages.
Figure 3:
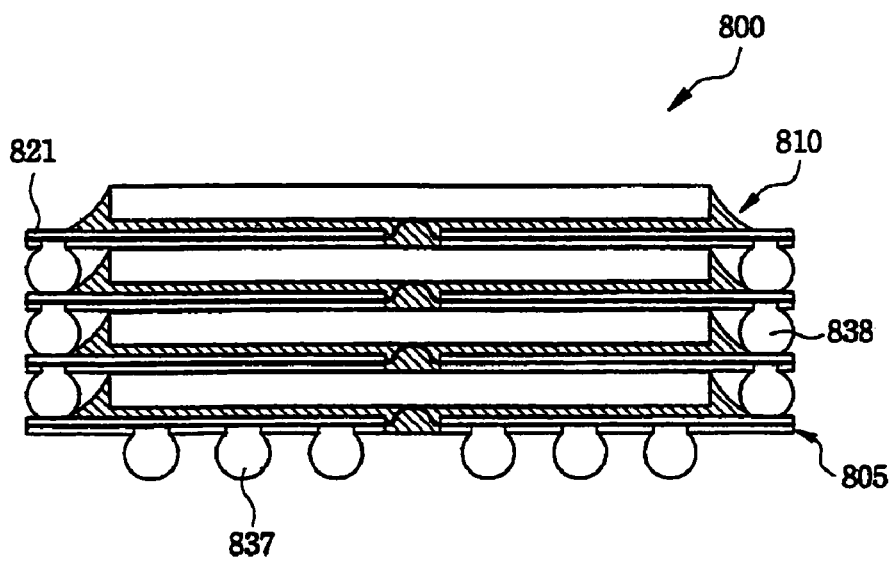
FIG. 3 is a further type of conventional stack package made of a plurality of chip scale packages.

The present invention will now be described more fully with reference to the accompanying drawings, in which embodiments of the invention are shown. This invention may, however, be embodied in many different forms and should not be construed as being limited to the embodiments set forth herein. Rather, these embodiments are provided so that this disclosure will be thorough and complete and will fully convey the concept of the invention to those skilled in the art. In the drawings, the shape of elements is exaggerated for clarity, and the same reference numerals in different drawings represent the same element.

Figure 4:
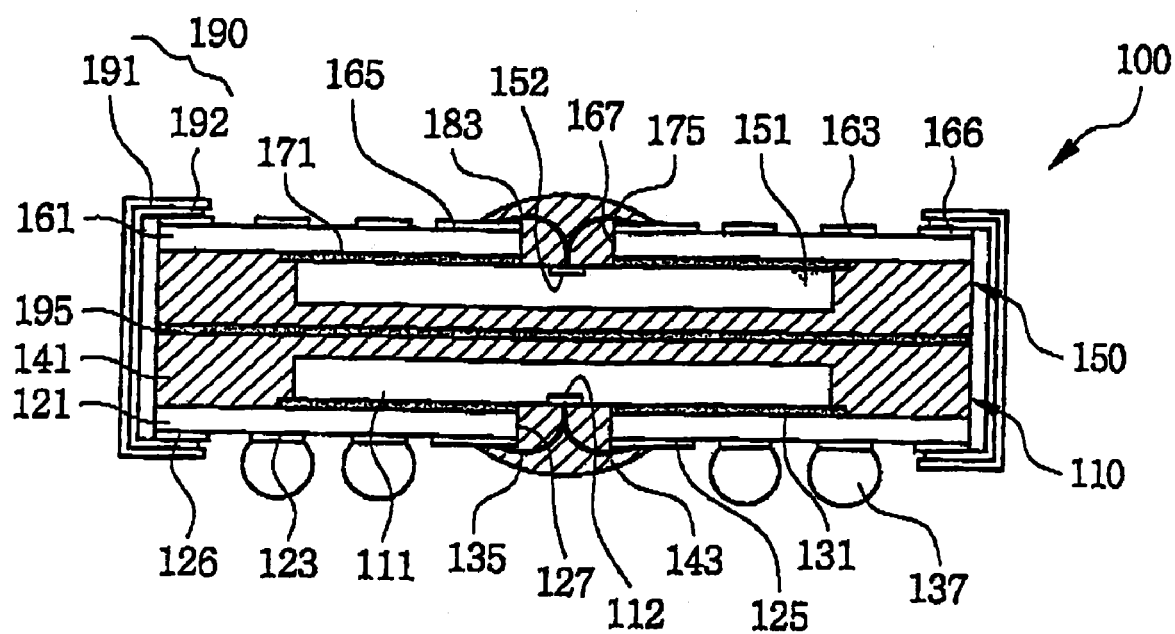
FIG. 4 is a stack package according to an embodiment of the present invention.

An embodiment of the present invention is disclosed in FIG. 4. Referring to FIG. 4, the stack package 100 comprises two chip scale packages 110, 150. The two chip scale packages 110, 150 are ordinary area array type packages and have the same structure, except that a plurality of solder balls 137 are formed only on the lower stacked chip scale package 110. The two chip scale packages 110, 150 are stacked in a manner that the ball land pads 163 of the upper stacked chip scale package 150 face in the opposite direction to the ball land pads 123 of the lower stacked chip scale package 110.

The lower stacked chip scale package 110 will be described referring to FIG. 4. The lower stacked chip scale package 110 is a conventional ball grid array (BGA) type package. A printed circuit board (PCB) or a tape circuit board may be used as a substrate 121 of the chip scale package 110. A plurality of ball land pads 123 are formed and electrically connected to circuit patterns 125 on the lower surface of the substrate 121. A plurality of solder balls 137 may be formed on the ball land pads 123 and function as I/O ports of the stack package 100. A semiconductor chip 111 is attached to the upper surface of the substrate 121 by an adhesive 131, and electrically connected to the circuit patterns 125.

A plurality of bonding pads 112 of the semiconductor chip 111 are electrically connected to the circuit patterns 125 by bonding wires 135 passing through a hole 127 formed in the central area of the substrate 121. In this embodiment, a center pad type semiconductor chip 111, which has bonding pads formed on the central region of the chip, is preferred. The semiconductor chip 111 is protected by the first encapsulating part 141, and the bonding wires 135, bonding pads 112 and circuit patterns 125 are protected by the second encapsulating part 143.

The upper stacked chip scale package 150 has the same structure as the lower stacked chip scale package 110 except that solder balls are not formed on the ball land pads 163. That is to say, the upper stacked chip scale package 150 is a land grid array type package that includes semiconductor chip 151 attached to an upper surface of the substrate 161 with adhesive 171. A plurality of bonding pads 152 on semiconductor chin 151 are electrically connected to the circuit patterns 165 by bonding wires 175 passing through a hole 167 formed in the central area of the substrate 161. In this embodiment, a center pad type semiconductor chip 151, which has bonding pads formed on the central region of the chip, is preferred. The bonding wires 175, bonding pads 152 and circuit patterns 165 are protected by the encapsulating part 183.

On the substrates 121, 161 of the two stacked chip size packages 110, 150, connection pads 126, 166, electrically connected to the circuit patterns 125, 165, are formed outside of the area in which the ball land pads 123, 163 are formed.

The two chip scale packages 110, 150 are stacked in a manner that the ball land pads 123, 163 of each chip scale package face in opposite directions. This allows the first encapsulating parts 141, 181 of the two chip scale packages 110, 150 to be attached to each other by an adhesive layer 195.

The connection pads 166 of the upper chip scale package 150 are electrically connected to the connection pads 126 of the lower chip scale package 110 by flexible circuit boards 190. Each flexible circuit board 190 comprises a base film 191 and wiring patterns 192 formed on the base film 191. The flexible circuit boards 190 are attached to the sides of the stack package 100, and the ends of the flexible circuit boards 190 may be electrically connected to the connection pads 126, 166 by tape automated bonding (TAB). Preferably, each end of the flexible circuit boards 190 is folded to increase the connecting area between the circuit boards 190 and the connection pads 126, 166.

Although the flexible circuit boards are used in this embodiment for electrically connecting the connection pads 126, 166, it is possible to make an electrical connection between the connection pads 126, 166 by other methods, such as via holes filled with conductive materials.

As described in this embodiment, the chip scale packages 110, 150 used for the stack package 100 have ordinary area array structures. Strictly speaking, the matrix of ball land pads 163 of the upper chip scale package 150 is the same as that of the lower chip scale package 110. Additionally, each chip scale package can be tested for its functional reliability. Therefore, the reliability of the stack chip package can be improved by using tested chip scale packages. Further, an addition of a new chip scale package to the stack package is easily accommodated because each chip scale package used for the stack package is standardized.

Additions of chip scale packages to the stack package will be described referring to FIG. 5 and FIG. 6.

Figure 5:
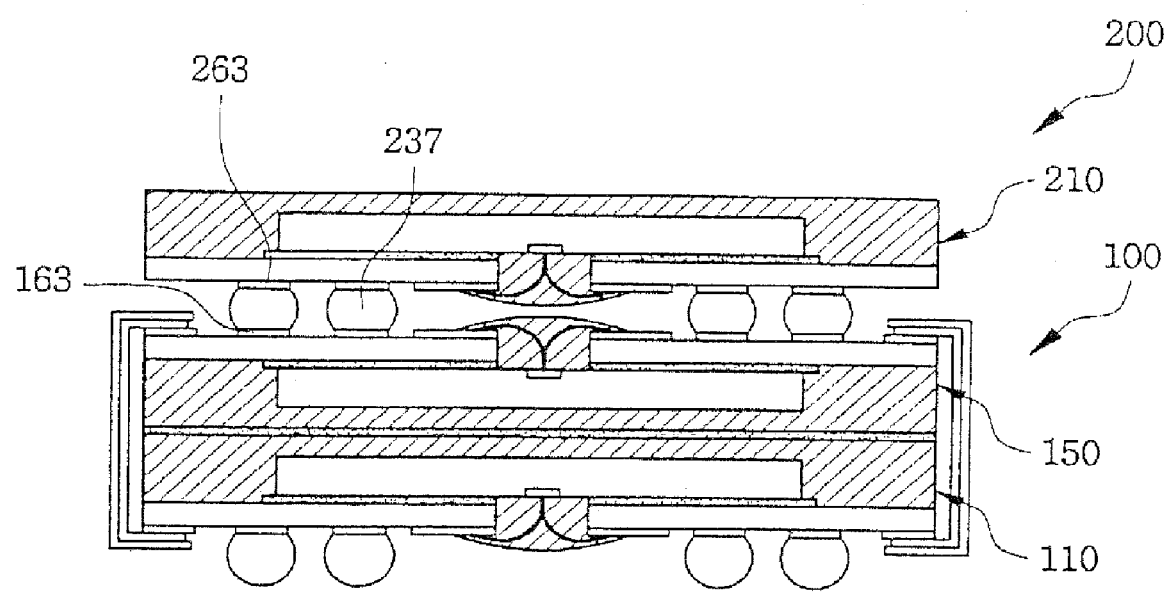
FIG. 5 is a stack package according to another embodiment of the present invention.

FIG. 5 shows another embodiment of the present invention, in which another chip scale package 210 is added to the stack package 100 disclosed previously in FIG. 4. This addition results in the stack package 200 now including three chip size packages 110, 150, and 210. Referring to FIG. 5, the ball land pads 263 of the highest stacked chip scale package 210 are electrically connected to the ball land pads 163 of the middle stacked chip scale package 150 by a plurality of solder balls 237.

Figure 6:
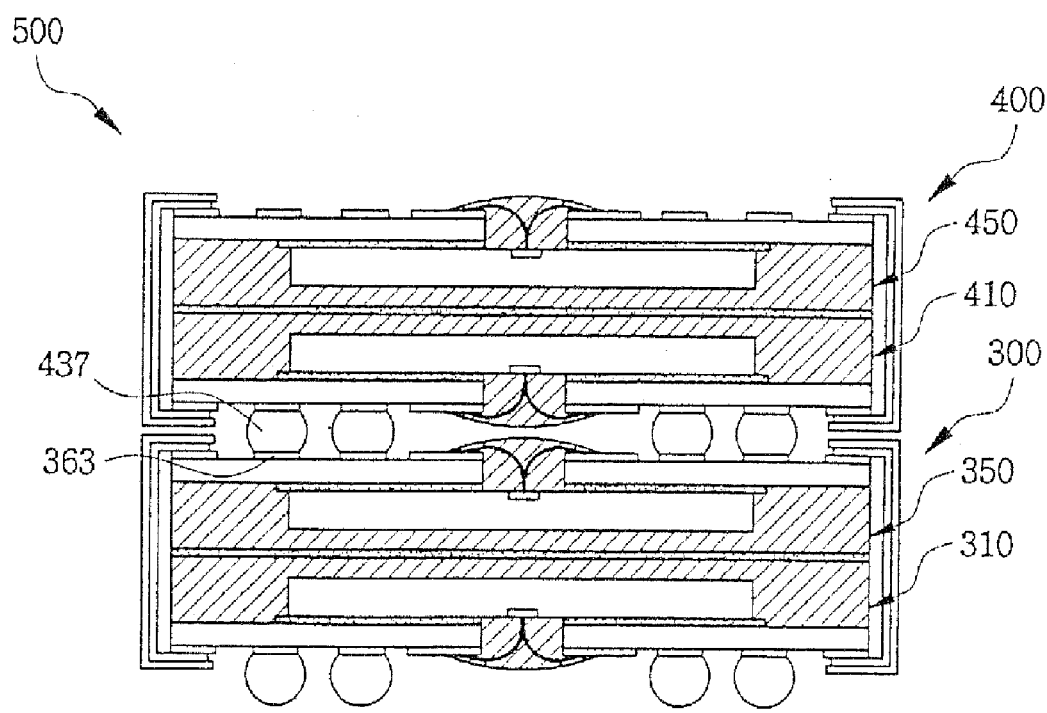
FIG. 6 is a stack package according to yet another embodiment of the present invention.

FIG. 6 shows yet another embodiment of the present invention, in which the stack package 500 comprises two of the stack packages disclosed in FIG. 4. This results in the stack package 500 now including four chip size packages 310, 350, 410, and 450. Referring to FIG. 6, chip scale packages 310, 350 are stacked to form a lower stack package 300, and chip scale packages 410, 450 are also stacked to form an upper stack package 400 by the previously described method in FIG. 4. Next, the upper stack package 400 is stacked on and electrically connected to the lower stack package 300 by an electrical connection between the ball land pads 463 of the chip scale package 410 and the ball land pads 363 of the chip scale package 350 through a plurality of solder balls 437.

By using the structure of stack packages disclosed in the embodiments, any desired number of ordinary area array type chip scale packages can be stacked. Further, because of the standardized structure of the chip scale package stacks, the production costs of the components used in forming these stacks can be reduced.

Although certain embodiments of the present invention have been shown and described in detail, it should be understood that various changes and modifications may be made therein without departing from the spirit and scope of the appended claims.

What is claimed is:

1. A method of forming a stack package of two or more area array type chip scale packages, the method comprising:
   forming a lower chip scale package of an adjacent pair of chip scale packages including a substrate, a plurality of ball land pads formed on a lower surface of the substrate, circuit patterns terminating in a plurality of connection pads formed outside the area in which the plurality of ball land pads are formed, the circuit patterns and the plurality of connection pads formed on the lower surface of the substrate and electrically connected to the plurality of ball land pads, and one or more chips formed on an upper surface of the substrate and electrically connected to the circuit patterns;
   forming an upper chip scale package of the adjacent pair of chip scale packages in the same manner as the lower chip scale package;
   attaching the upper chip scale package to the lower chip scale package so that the ball land pads of the upper chip scale package face the opposite direction as the ball land pads of the lower chip scale package; and
   electrically connecting the circuit patterns of the upper chip scale package to the circuit patterns of the lower chip scale package.

2. The method of claim 1, wherein electrically connecting the circuit patterns of the two chip scale packages of an adjacent pair of chip scale packages further comprises attaching flexible connecting boards to connection pads formed on the same surface of each chip scale package substrate as the ball landing pads.

3. The method according to claim 2, further comprising bending the ends of the connecting boards to attach to a larger surface of the connection pads.

4. The method of claim 1, further comprising:
   forming a hole in the substrate of each chip scale package; and
   electrically connecting the chip to the circuit patterns by bonding wires through the hole.

5. The method of claim 1, further comprising:
   forming a first encapsulating part over an upper surface of each chip scale package and chip; and
   forming a second encapsulating part over the bonding pads and bonding wires of each chip scale package.

6. The method of claim 5, further comprising attaching the two chip scale packages with an adhesive applied on the first encapsulating part of each chip scale package.

7. The method of claim 1, further comprising forming a plurality of solder balls on the ball lands of the lower chip scale package of an adjacent pair of chip scale packages.

8. A method of forming a stack package of two or more chip scale packages, the method comprising:
   forming a first chip scale package having a substrate that defines first and second sides of the first chip scale package, the second sides opposite the first sides, a first matrix of ball land pads within a defined first area, one or more chips installed on an upper surface of the substrate, and a plurality of first connection pads outside the defined first area near the first and second sides of the chip scale package, the first chip scale package including a first circuit pattern formed on a lower surface of the substrate, the first circuit pattern electrically connected to the plurality of first connection pads; and
   forming a second chip scale package having a substrate that defines first and second sides of the second chip scale package, the second sides opposite the first sides, a second matrix of ball land pads within a defined second area, one or more chips installed on an upper surface of the substrate, and a plurality of second connection pads outside the defined second area near the first and second sides of the chip scale package, the chip scale package including a second circuit pattern formed on a lower surface of the substrate, the second circuit pattern electrically connected to the plurality of second connection pads, wherein the lower surfaces of the substrates of the chip scale packages face the opposite direction.

9. The method of claim 8, wherein the plurality of first connection pads and the plurality of second connection pads are electrically connected with one another via connecting boards attached to the first and second sides of the first and second chip scale packages.

10. The method of claim 9, wherein the first matrix of ball land pads is substantially the same size as the second matrix of ball land pads.

11. The method of claim 9, further comprising forming a plurality of solder balls only on the ball land pads of the first chip scale package.

12. The method of claim 11, further comprising forming a third chip scale package having a third matrix of ball land pads the same size as the first and second matrices of ball land pads, wherein the third chip scale package is electrically connected to the ball land pads of the second chip scale package through a plurality of solder balls formed on the third matrix of ball land pads on a lower surface of a substrate of the third chip scale package.

13. The method of claim 11, further comprising:
   forming a third chip scale package having a substrate, a third matrix of ball land pads, and one or more chips installed on a lower surface of the substrate; and
   forming a fourth chip scale package having a substrate, a fourth matrix of ball land pads, and one or more chips installed on a lower surface of the substrate,
   wherein the lower surfaces of the substrates of the third and fourth chip scale packages face the opposite direction,
   wherein the third and fourth matrices of ball land pads are the same size as the first and second matrices of ball land pads, and
   wherein the third chip scale package is electrically connected to the ball land pads of the second chip scale package through a plurality of solder balls formed on the third matrix of ball land pads of the third chip scale package.

14. A method of forming a stackable stack package, the method comprising:

forming a first chip scale package including a first substrate, the first substrate having one or more first chips on a first surface of the first substrate, the first substrate further having one or more first ball land pads within a given first area on an opposite surface of the first substrate, the first substrate further having a plurality of first circuit patterns connecting the one or more first chips to the one or more ball land pads, the plurality of first circuit patterns terminating outside the given area in a plurality of first connection pads; and forming a second chip scale package including a second substrate, the second substrate having one or more second chips on a first surface of the second substrate, the second substrate further having one or more second ball land pads within a second given area on an opposite surface of the second substrate, the second substrate further having a plurality of second circuit patterns connecting the one or more second chips to the one or more second ball land pads, the plurality of second circuit patterns terminating outside the given second area in a plurality of second connection pads, wherein the first and the second chip scale packages face opposite directions from one another in a stack.

15. The method of claim 14, wherein the first and the second chip scale packages are interconnected by one or more connecting boards extending between and electrically connecting the plurality of first connection pads with the plurality of second connection pads.

16. The method of claim 15, further comprising forming one or more solder balls only on the one or more first ball land pads, thereby leaving exposed the one or more second ball land pads for stacking of one or more solder ball-equipped chip scale packages thereon.

17. The method of claim 16, further comprising using first and second encapsulants to protect inner surfaces of the one or more first and second chips, wherein the inner surfaces of the one or more first and second chips inwardly face one another.

18. The method of claim 17, further comprising using an adhesive layer adhering together the first and second encapsulants and the encapsulated one or more first and second chips.

\* \* \* \* \*

UNITED STATES PATENT AND TRADEMARK OFFICE
CERTIFICATE OF CORRECTION

PATENT NO. : 7,479,408 B2  Page 1 of 1
APPLICATION NO. : 11/536611
DATED : January 20, 2009
INVENTOR(S) : Dong-Ho Lee It is certified that error appears in the above-identified patent and that said Letters Patent is hereby corrected as shown below:

Column 1, line 36, the word "interior." should read -- inferior. --.

Signed and Sealed this

Twenty-fourth Day of November, 2009

David J. Kappos
*Director of the United States Patent and Trademark Office*